(12) United States Patent
Luyken et al.

(10) Patent No.: US 6,798,000 B2
(45) Date of Patent: Sep. 28, 2004

(54) FIELD EFFECT TRANSISTOR

(75) Inventors: Richard Johannes Luyken, München (DE); Till Schlösser, Dresden (DE); Thomas Peter Haneder, Müchen (DE); Wolfgang Hönlein, Unterhaching (DE); Franz Kreupl, München (DE)

(73) Assignee: Infineon Technologies AG (DE)

( * ) Notice: Subject to any disclaimer, the term of this patent is extended or adjusted under 35 U.S.C. 154(b) by 0 days.

(21) Appl. No.: 10/275,337

(22) PCT Filed: Jul. 3, 2001

(86) PCT No.: PCT/DE01/02451
§ 371 (c)(1),
(2), (4) Date: Dec. 18, 2002

(87) PCT Pub. No.: WO02/03482
PCT Pub. Date: Jan. 10, 2002

(65) Prior Publication Data
US 2003/0148562 A1 Aug. 7, 2003

(51) Int. Cl.[7] .............................................. H01L 29/76
(52) U.S. Cl. ...................... 257/213; 257/288; 257/401; 257/410; 257/40
(58) Field of Search ................................. 257/213, 288, 257/401, 410, 40

(56) References Cited

FOREIGN PATENT DOCUMENTS

| WO | WO 99/04440 |   | 1/1999 |
|---|---|---|---|
| WO | WO 00/51186 | * | 8/2000 |

OTHER PUBLICATIONS

Shea H.R. et al., Manipulation of Carbon Nanotubes and Properties of Nanolube Field–Effect Transistors and Rings, Microelectronic Engineering, Elsevier Publishers BV, vol. 46, No. 1–4, pp.101–104 (1999).

Vedeneev A.S. et al., Molecular Scale Rectifying Diodes Based on Y Junction Carbon Nanotubes, Proceedings of the IEDM Conference, IEDM 99, pp. 231–233 (1999).

Chung, Sung–Wook et al., Silicon nanowire devices, Applied Physics Letters, vol. 78, No. 15, pp. 2068–2070 (1999).

(List continued on next page.)

Primary Examiner—Mark V. Prenty
(74) Attorney, Agent, or Firm—Altera Law Group, LLC; Jeffrey R. Stone

(57) ABSTRACT

A field-effect transistor that having a nanowire, which forms a source region, a channel region and a drain region of the field-effect transistor, the nanowire being a semiconducting and/or metallically conductive nanowire. The field-effect transistor also has at least one nanotube, which forms a gate region of the field-effect transistor, the nanotube being a semiconducting and/or metallically conductive nanotube. The nanowire and the nanotube are arranged at a distance from one another or set up in such a manner that it is substantially impossible for there to be a tunneling current between the nanowire and the nanotube, and that the conductivity of the channel region of the nanowire can be controlled by means of a field effect as a result of an electric voltage being applied to the nanotube.

24 Claims, 4 Drawing Sheets

OTHER PUBLICATIONS

Martel, R. et al., Single– and multi–wall carbon nanotube field–effect transistors, Applied Physics Letters, vol. 73, No. 17, pp. 2447–2449, Oct. 1998.

Han, W. et al., Synthesis of Boron Nitride Nanotubes from Carbon Nanotubes by a Substitution Reaction, Applied Physics Letters, vol. 73, No. 21, pp. 3085–3087, Nov. 1998.

Dekker, C., Carbon Nanotubes as Molecular Quantum Wires, Physics Today, pp. 22–28, May, 1999.

Suh, Jung Sang and Lee, Jin Seung, Highly ordered two–dimensional carbon nanotube arrays, Applied Physics Letters, vol. 75, No. 14, pp. 2047–2049, Oct. 1999.

Ren Z.F. et al., Synthesis of Large Arrays of Well–Aligned Carbon Nanotubes on Glass, Science, vol. 282, pp. 1105–1107, Nov. 1998.

Menon, M. and Srivastava, D., Carbon Nanotube "T Junctions": Nanoscale Metal–Semiconductor Metal Contact Devices, Physics Review Letters, vol. 79, No. 22, pp. 4453–4456, Dec. 1997.

Hu, J., et al., Controlled growth and electrical properties of heterojunctions of carbon nanotubes and silicon nanowires, Nature, vol. 399, pp. 48–51, May, 1999.

* cited by examiner

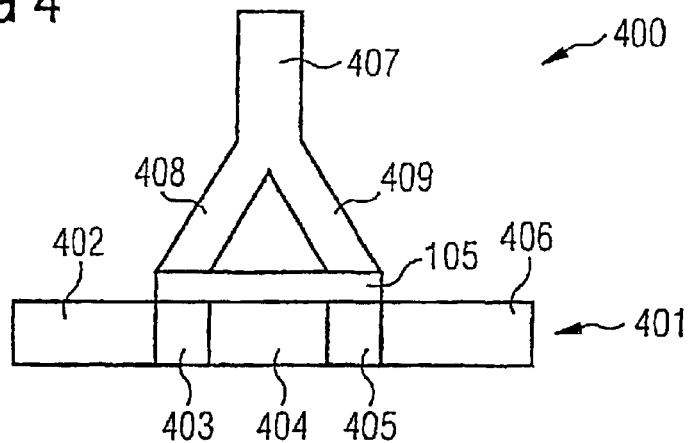
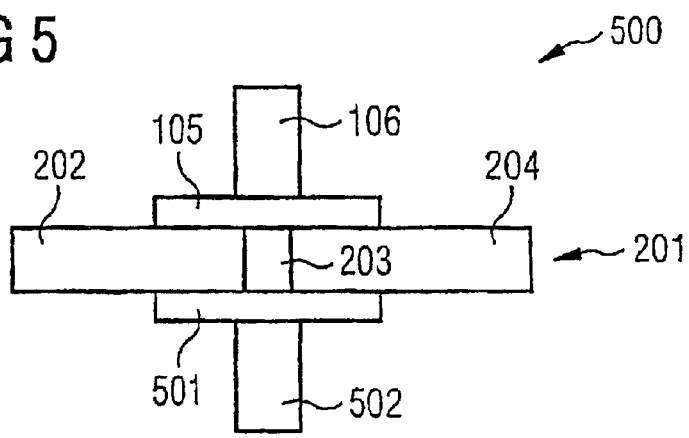
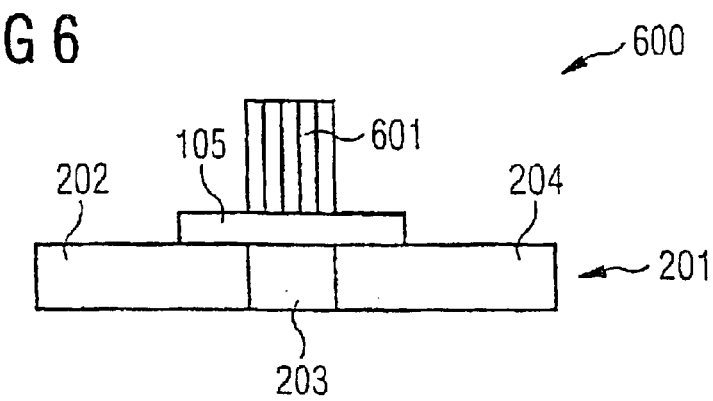

FIELD EFFECT TRANSISTOR

The invention relates to a field-effect transistor. [1] has disclosed a wide range of different field-effect transistors. One example of a field-effect transistor of this type is what is known as the MOS field-effect transistor.

According to current technology, a MOS field-effect transistor still has a chip surface area of at least approximately 0.8 $\mu m^2$ to 1.5 $\mu m^2$.

Furthermore, basic principles of what are known as carbon nanotubes are known from [2] and [4].

A process for producing carbon nanotubes by growing them on a substrate is known from [3].

A further process for producing carbon nanotubes by vapor deposition of the carbon nanotubes is described in [4].

Furthermore, [5] has disclosed a process in which an electrically semiconducting carbon nanotube or metallically conductive carbon nanotube is converted into a boron nitride nanotube, which has an electrically insulating action, by means of doping with boron atoms and nitrogen atoms.

Furthermore [6] has disclosed a field-effect transistor with a carbon nanotube which couples two gold electrodes to one another via silicon dioxide substrate in such a manner that they can be electrically controlled. In this case, the gold electrodes form the source region and the drain region of the field-effect transistor, and the controlled channel region of the field-effect transistor is formed by the carbon nanotube. The electrical properties, in particular the electrical conductivity, of the carbon nanotube which forms the channel region is controlled by means of a silicon layer which is located below the silicon dioxide layer and is used as gate region of the field-effect transistor.

Furthermore, a process for producing a silicon nanowire is known from [7]. Therefore, the invention is based on the problem of providing a field-effect transistor which takes up less space that the known field-effect transistors.

A field-effect transistor has a nanowire, which forms a source region, a channel region and a drain region of the field-effect transistor, the nanowire being a semiconducting and/or metallically conductive nanowire. Furthermore, the field-effect transistor has at least one nanotube, which forms a gate region of the field-effect transistor, the nanotube being a semiconducting and/or metallically conductive nanotube. The nanowire and the nanotube are arranged at a distance from one another in such a manner or set up in such a manner that it is substantially impossible for there to be a tunneling current between the nanowire and the nanotube, and that the conductivity of the channel region of the nanowire can be controlled by means of a field effect as a result of an electric voltage being applied to the nanotube.

According to one configuration of the invention, the field-effect transistor has, as nanowire, a first nanotube, which forms a source region, a channel region and a drain region of the field-effect transistor. The first nanotube is a semiconducting and/or metallically conductive nanotube. Furthermore, according to this configuration of the invention, the nanotube which forms the gate region is formed by a second nanotube, the second nanotube being a semiconducting and/or metallically conductive nanotube. The first nanotube and the second nanotube are arranged at a distance from one another which is such that it is substantially impossible for there to be a tunneling current between the nanotubes and that the conductivity of the channel region of the first nanotube can be controlled by means of a field effect as a result of an electric voltage being applied to the second nanotube.

Since the field-effect transistor is formed substantially from nanotubes, therefore, the result is a transistor which takes up a considerably smaller surface area than the known field-effect transistors.

Furthermore, a switching operation between two states of the field-effect transistor is possible with a greatly reduced power loss, in particular on account of the considerably lower capacitance compared to conventional field-effect transistors and the very good electrical conductivity in particular of the carbon nanotubes.

The conductivity of the first nanotube is varied as a result of local application of an electrical potential and therefore of an electric field in particular in the section of the first nanotube which forms the channel region, creating the functionality of a field-effect transistor.

Any material can be used as the material for the first nanotube or the nanowire, provided that the first nanotube or the nanowire has electrically semiconducting and/or metallically conductive properties.

Moreover, the source region or the drain region and the channel region of the first nanotube or of the nanowire may be doped. In this way, it is possible to produce a potential barrier in the channel region, leading to a reduction in leakage currents in the quiescent state. The source region and the drain region as well as the channel region are preferably doped in such a way that a pn junction or an pn junction is formed both between the source region and the channel region and between the drain region and the channel region.

However, it is also possible for only the source region or the drain region or the channel region to be doped. To reduce leakage currents, in the case of pn junctions or pn junctions, it is furthermore expedient to leave small areas with a size of approximately 1 nm to approximately 5 nm of the nanotube between the n-doped region and the n-doped region in undoped form.

Obviously, the invention can be considered to lie in the fact that a second nanotube is arranged in the vicinity of the channel region of the first nanotube or of the nanowire, as a controlling element, in such a manner that the conductivity of the first nanotube can be controlled as required in that part of the first nanotube which forms the channel region.

It should be noted, that according to a refinement of the invention, the nanowire and the nanotube which forms the gate region or the two nanotubes do not touch one another, i.e. they are not brought into physical contact with one another, but rather are separated from one another by a dielectric, in the most simple case by air, a gas or vacuum. Nevertheless, it should be ensured that the conductivity of the first nanotube can be influenced to a sufficient extent by means of the field effect.

Alternatively, the dielectric may also be formed by an electrically nonconductive gas which is introduced between the two nanotubes.

The shortest distance between the first nanotube and the second, controlling nanotube is selected as a function of a maximum tolerable tunneling current between the two nanotubes and the desired supply voltage with which the field-effect transistor is operated.

By way of example, in the case of two carbon nanotubes, with the second nanotube oriented substantially perpendicular to the first nanotube, given a diameter of the two nanotubes of from 1 nm to 10 nm, the distance is to be selected in a range from 0.5 nm to 5 nm. In this case, obviously, the two nanotubes are arranged in a T shape with respect to one another, so that the field-effect transistor has a T-shaped structure.

Furthermore, it is also possible for an insulator layer, i.e. a layer of electrically nonconductive material, for example of an oxide material, e.g. of silicon dioxide, or of a nitride material, e.g. of silicon nitride, to be used as the dielectric.

In this context, it is merely necessary for it to be substantially impossible for there to be a flow of current between the two nanotubes, or at most for a negligible tunneling current to be possible.

The nanotubes may be designed as semiconducting and/ or metallically conductive carbon nanotubes. Furthermore, it is possible to use single-walled or multi-walled nanotubes, in particular carbon nanotubes.

The second nanotube may have three ends, in which case an electrical voltage can be applied to one end and the two further ends are arranged in such a manner that, on account of the applied electrical voltage, they can be used to change the conductivity of the channel region of the first nanotube.

This refinement makes it possible to increase the size of the channel region, i.e. the active region in which the conductivity can be changed, with the result that leakage currents which occur in the blocking state of the field-effect transistor are reduced considerably.

According to a further configuration of the invention, the field-effect transistor has two gates, each of which can be used to switch the field-effect transistor, i.e. to change the conductivity in that part of the first nanotube which forms the channel region of the field-effect transistor.

This configuration improves the susceptibility to errors and the resistance to interference.

In this case, there is a third nanotube, which forms a second gate region of the field-effect transistor, the third nanotube being a semiconducting and/or metallically conductive nanotube. The first nanotube and the third nanotube are arranged at a distance from one another which is such that it is impossible for there to be a tunneling current between the nanowire and the nanotubes and that the conductivity of the channel region of the nanowire or of the first nanotube can be controlled by means of a field effect as a result of an electric voltage being applied to the third nanotube.

Furthermore, the second nanotube and the third nanotube may be electrically coupled to one another.

In general terms, it is in principle possible for a predeterminable number of further carbon nanotubes to be grown on further insulator layers as further gates of the field-effect transistor, with the result that a simple logic OR arrangement is created by means of a field-effect transistor.

Furthermore, according to a further configuration of the invention each nanotube may have a plurality or even a multiplicity, i.e. an entire bundle, of individual nanotubes, with the result that the stability and reliability of the field-effect transistor which is formed are further improved.

The ends of the nanotubes used in the field-effect transistor may optionally be open or closed.

According to a further configuration of the invention, the field-effect transistor has a nanowire, which forms a source region, a channel region and a drain region of the field-effect transistor. A nanotube, which has an insulating region and a semiconducting region or a metallically conductive region, is applied to the nanowire. The insulating region of the nanotube is applied to the channel region of the nanowire, in such a manner that the insulating region of the nanotube forms an insulator of the field-effect transistor. Furthermore, the nanotube is applied to the nanowire in such a manner that the semiconducting region of the nanotube or the metallically conductive region of the nanotube forms a gate region of the field-effect transistor.

The nanowire may be a silicon nanowire.

According to an alternative configuration of the invention, the nanowire may be a further nanotube, for example a carbon nanotube. A particular advantage of this configuration is the compactness of the solution, i.e. the fact that both elements of the field-effect transistor, namely both the controlling element (gate) and the controlled element (channel), are each formed by a carbon nanotube, with the associated advantageous material properties.

The further carbon nanotube may have at least one semiconducting region and at least one metallically conductive region, it being possible for the semiconducting region to be arranged between two metallically conductive regions.

In this case, the semiconducting region of the further carbon nanotube preferably forms the channel region of the field-effect transistor, and the two metallically conductive regions form the source region and the drain region of the field-effect transistor.

The nanotube may be composed of a plurality of individual nanotubes, for example of an electrically insulating nanotube, according to one configuration of the invention a boron nitride nanotube, and one or more semiconducting or metallically conductive carbon nanotubes.

The insulating region of the nanotubes may be formed by a boron nitride nanotube.

In general terms, in this context it should be noted that carbon nanotubes have an electrical conductivity which is dependent on the tube parameters. For example, depending on the tube parameters there are electrically semiconducting carbon nanotubes and metallically conductive carbon nanotubes. By contrast, boron nitride nanotubes which are structurally identical are electrically insulating, since they have an energy band gap of 4 eV. The semiconducting region or the metallically conductive region of the nanotube may be a carbon nanotube, i.e. a semiconducting carbon nanotube or a metallically conductive carbon nanotube.

It is therefore possible to use both standard types of carbon nanotubes, with the result that the relatively complex checking of the electrical properties of the carbon nanotubes produced in each case could even be dispensed with if desired and, by way of example, the transistor parameters do not necessarily have to be known.

Within the context of the invention, it is possible to use both single-walled and multi-walled (carbon) nanotubes.

A further field-effect transistor has a nanowire, which forms a source region, a channel region and a drain region of the field-effect transistor. At least one electrically insulating nanotube, which forms an insulator of the field-effect transistor, is applied to the nanowire. Furthermore, the field-effect transistor has at least one electrically semiconducting or metallically conductive nanotube which is applied to the insulating nanotube and forms a gate region of the field-effect transistor.

Evidently, the electrically insulating nanotube or the insulating region of a nanotube is applied to the nanowire in such a manner that, by means of the semi-conducting or metallically conductive nanotube which forms the gate region, it is possible to control the density of the electrical charge carriers by means of a field effect which is established in the channel region of the field-effect transistor, i.e. in the nanowire, and therefore to switch the field-effect transistor between two transistor states, namely a conductive transistor state and a nonconductive transistor state.

Therefore, the channel conductivity of the field-effect transistor according to the invention, as in conventional field-effect transistors, is controlled by means of an electric field by an electric voltage which is applied to a gate electrode, i.e. by an electric voltage which is applied to the gate region of the field-effect transistor.

A considerable advantage of the invention is that the field-effect transistor which has been described is very small, i.e. its size may be produced with dimensions of as little as 100 nm² and below.

Furthermore, the fact that a monomolecular, i.e. single-piece field-effect transistor is formed from nanotubes, generally from a nanowire and a nanotube, means that the electronic component can very easily be integrated in interconnects of an electric circuit.

Furthermore, a further advantage of the invention resides in the compatibility of the field-effect transistors with respect to silicon material which is usually employed in semiconductor circuits.

In general terms, the invention can be considered to lie in the fact that a further nanotube is applied to a nanowire, for example a carbon nanotube, in such a manner that the single-piece, i.e. monomolecular element which is thereby formed as the field-effect transistor represents a separate electronic, monomolecular component.

Exemplary embodiments of the invention are illustrated in the figures and are explained in more detail below. In the drawing:

FIG. 4 shows a cross section through a field-effect transistor in accordance with a fourth exemplary embodiment of the invention;

FIG. 5 shows a cross section through a field-effect transistor in accordance with a fifth exemplary embodiment of the invention; and FIG. 6 shows a cross section through a field-effect transistor in accordance with a sixth exemplary embodiment of the invention.

In the exemplary embodiments described below, identical elements of a field-effect transistor are in some case denoted by identical reference symbols.

FIG. 1 shows a field-effect transistor 100 in accordance with a first exemplary embodiment of the invention.

Figure 1:
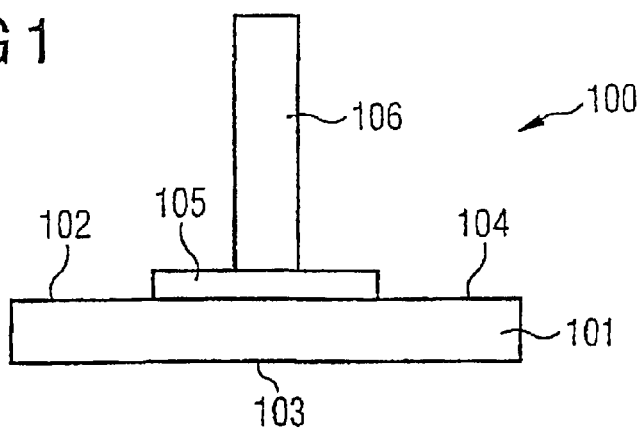
FIG. 1 shows a cross section through a field-effect transistor in accordance with a first exemplary embodiment of the invention.

The field-effect transistor 100 has an electrically semiconducting or metallically conductive first carbon nanotube 101 with a length of approximately up to 100 nm and a thickness of approximately 1 nm to 10 nm.

The first carbon nanotube 101 and all the carbon nanotubes described below, including the carbon nanotubes of the further exemplary embodiments, are produced by means of a vapor deposition process, as described in [2], or by being grown on, as described in [3].

The first carbon nanotube 101 has a source region 102, a channel region 103 and a drain region 104 of the field-effect transistor 100.

In the channel region 103, an insulator layer 105 comprising silicon nitride or silicon dioxide is applied to the first carbon nanotube 101 by means of a CVD process or a sputtering process. The insulator layer 105 has a thickness of approximately 2 nm to 5 nm and a length which is at least as great as the length of the channel region 103.

A second carbon nanotube 106 is grown on the insulator layer, substantially perpendicular to the first carbon nanotube 101, using the process described in [2], [3]

The second carbon nanotube 106 has a length of approximately 10 nm and a thickness of approximately 1 nm to 10 nm.

In this context, it should be noted that for the transistor functionality it is substantially irrelevant how long or how thick a carbon nanotube 101, 106 is. They may also differ from one another considerably.

Furthermore, the carbon nanotubes 101, 106 may also have a bent, i.e. curved shape, provided that the functionality described above is ensured.

An electric driving voltage, the gate voltage, is applied to the second carbon nanotube 106, which functions as the gate of the field-effect transistor, with the result that an electric field is generated. The electric field, as a result of a field effect, changes the potential in the channel region 103 and thereby controls the electrical conductivity of the first carbon nanotube 101.

Figure 2:
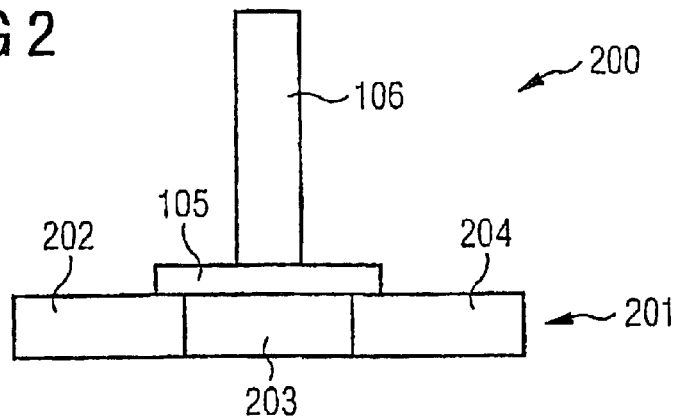
FIG. 2 shows a cross section through a field-effect transistor in accordance with a second exemplary embodiment of the invention.

FIG. 2 shows a field-effect transistor 200 in accordance with a second exemplary embodiment of the invention.

The field-effect transistor 200 differs from the field-effect transistor 100 in accordance with the first exemplary embodiment substantially through the fact that the first carbon nanotube 201 is formed by three carbon nanotubes 202, 203, 204 which are coupled to one another in an electrically conductive manner.

A first part-nanotube 202, which forms the source region of the field-effect transistor 200, is a metallically conductive carbon nanotube.

A second part-nanotube 203, which forms the channel region of the field-effect transistor 200, is a semiconducting carbon nanotube.

A third part-nanotube 204, which forms the drain region of the field-effect transistor 200, is once again a metallically conductive carbon nanotube. According to the second exemplary embodiment, the second part-nanotube 203 is longer than the thickness of the second carbon nanotube 106, i.e. in other words, the second part-nanotube 203 extends laterally beyond the diameter of the second carbon nanotube 106.

Figure 3:
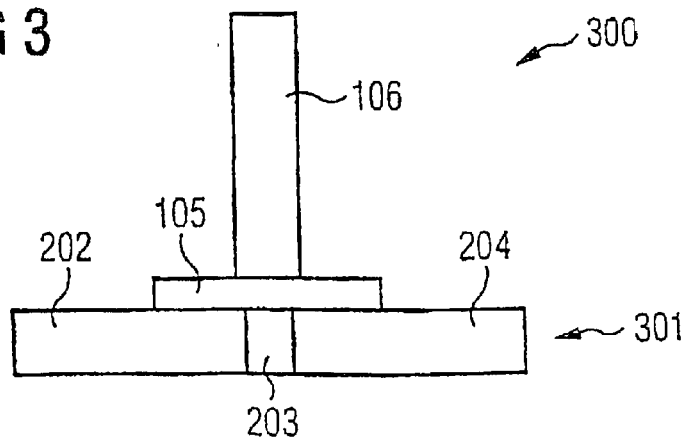
FIG. 3 shows a cross section through a field-effect transistor in accordance with a third exemplary embodiment of the invention.

FIG. 3 shows a field-effect transistor 300 in accordance with a third exemplary embodiment of the invention.

The field-effect transistor 300 differs from the field-effect transistor 200 in accordance with the second exemplary embodiment substantially through the fact that the second part-nanotube 203 is shorter than the thickness of the second carbon nanotube 106, i.e. in other words, the second part-nanotube 203, i.e. the extent of the channel region, is laterally shorter than the diameter of the second carbon nanotube 106.

In general terms, it should be noted that the longer the channel region, for example the second part-nanotube 203, the lower the leakage currents within the blocked field-effect transistor. On the other hand, the influence of the second carbon nanotube 106, which forms the gate of the field-effect transistor, increases the shorter the channel region, for example the second part-nanotube 203.

FIG. 4 shows a field-effect transistor 400 in accordance with a fourth exemplary embodiment of the invention.

Overall, the first carbon nanotube 401 of the field-effect transistor 400 has five part-nanotubes 402, 403, 404, 405, 406.

A first part-nanotube 402, which forms the source region of the field-effect transistor 400, is a metallically conductive carbon nanotube.

The channel region of the field-effect transistor 400 is formed by the second part-nanotube 403, the third part-nanotube 404 and the fourth part-nanotube 405, the second part-nanotube 403 being a semiconducting carbon nanotube, the third part-nanotube 404 being a metallically conductive carbon nanotube and the fourth part-nanotube 405 once again being a semiconducting carbon nanotube.

The fifth part-nanotube 406, which forms the drain region of the field-effect transistor 400, is once again a metallically conductive carbon nanotube. Therefore, the channel region is generally formed by part-nanotubes, a semiconducting carbon nanotube being arranged at each end of the channel region, and any desired number of metallically conductive and semiconducting carbon nanotubes being arranged between them.

According to this exemplary embodiment, the second carbon nanotube 407 is gamma-shaped, i.e. the second carbon nanotube 407 has two branches 408, 409, or in general terms any desired number of branches, the branches 408, 409 being arranged on the insulator layer 105 above the region of the second part-nanotube 403 and of the fourth part-nanotube 405, with the result that the channel region of the field-effect transistor 400 can be widened in a simple way.

FIG. 5 shows a field-effect transistor 500 in accordance with a fifth exemplary embodiment of the invention.

The field-effect transistor 500 differs from the field-effect transistor 300 in accordance with the third exemplary embodiment substantially through the fact that a second insulator layer 501 is applied to the first carbon nanotube in the channel region of the transistor and a third carbon nanotube 502 is grown on the insulator layer.

The third carbon nanotube 502 is electrically coupled to the second carbon nanotube 106, so that, as can be seen, a field-effect transistor 500 with a plurality of gates is formed.

In general terms, it is in principle possible for a predeterminable number of further carbon nanotubes (not shown) to be grown on further insulator layers or one insulator layer which is applied continuously all the way around the first carbon nanotube.

FIG. 6 shows a field-effect transistor 600 in accordance with a sixth exemplary embodiment of the invention.

The field-effect transistor 600 differs from the field-effect transistor 300 in accordance with the third exemplary embodiment substantially through the fact that the second carbon nanotube is formed by a multiplicity, i.e. as it were, a bundle of carbon nanotubes 601, which together are used as the gate of the field-effect transistor 600.

A common feature of the exemplary embodiment illustrated is that the flow of current of electrical charge carriers in the channel region of the controlled nanowire is controlled by means of the electric field generated at the gate region by means of the field effect which occurs as a result of an electric voltage being applied to the gate region of the respective field-effect transistor.

Figure 7B:
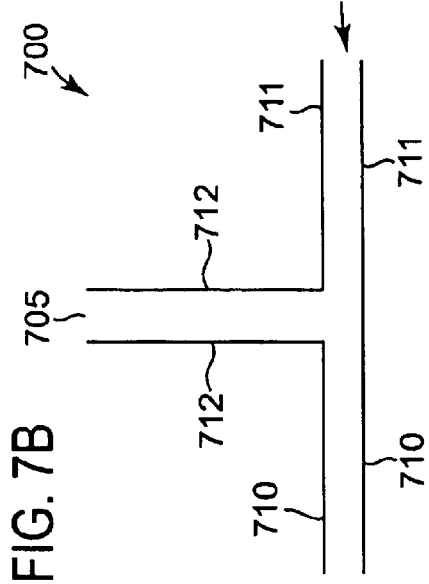
FIGS. 7A and 7B show a cross section through a field-effect transistor in accordance with a seventh exemplary embodiment of the invention, FIG. 7A showing the profile of the materials and FIG. 7B showing the profile of the walls.
Figure 7A:
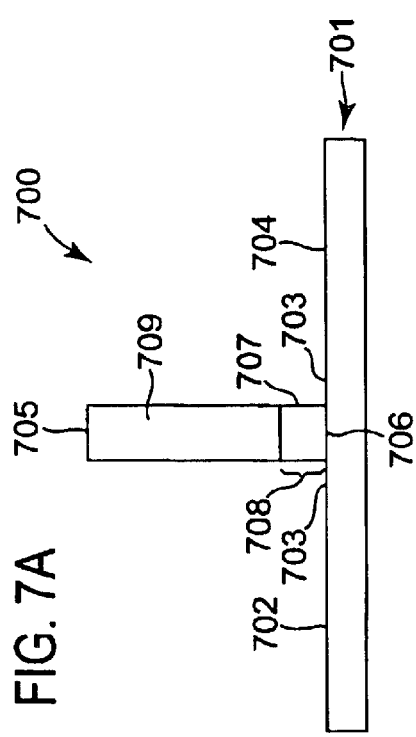

FIG. 7A shows a cross section through a field-effect transistor 700 in accordance with a seventh exemplary embodiment of the invention.

The field-effect transistor 700 has a semiconducting first carbon nanotube 701, which forms a source-channel-drain structure of the field-effect transistor 700, i.e. the semiconducting first carbon nanotube forms a source region 702, a channel region 703 and a drain region 704 of the field-effect transistor 700.

The semiconducting first carbon nanotube 701 is produced by means of the deposition process described in [2] or [3].

A second carbon nanotube 705 is applied to the semiconducting first carbon nanotube 701.

According to this exemplary embodiment, the second carbon nanotube 705 is deposited on the first carbon nanotube 701 by means of the vapor deposition process described in [2] or [3].

Alternatively, nanotubes which have already been produced and have three end regions, i.e. connections, can be used, as described, for example, in [8] as T-shaped or Y-shaped nanotubes.

The second carbon nanotube 705, which is electrically metallically conductive after it has been grown on or deposited, is converted into a boron nitride nanotube 707 in a predetermined region 708 which extends from a contact region 706 between the first carbon nanotube 701 and the second carbon nanotube 705, along the second carbon nanotube 705, with a predetermined length. In other words, what this means is that the second carbon nanotube 705 is doped with boron atoms and nitrogen atoms in a predetermined region using the process described in [6], so that the predetermined region 708 acquires an electrically insulating structure.

The remaining region of the second carbon nanotube 705 remains an electrically metallically conductive or semiconducting carbon nanotube, which according to this exemplary embodiment is denoted by reference numeral 709. The electrically insulating region 708, which has been doped with the boron atoms and the nitrogen atoms, of the field-effect transistor 700, in the context of the field-effect transistor 700 which has been formed, acts as an insulator between the channel region 703 to which the second carbon nanotube 705 has been applied and the region 709 of the second carbon nanotube 705 which is still metallically conductive and functions as the gate region.

In this way, the charge density of the electrical charge carriers in the channel region 703 and therefore the electrical conductivity of the channel region 703 of the field-effect transistor 700 can be controlled by electrically driving the field-effect transistor 700, in particular by applying an electric voltage to the gate region 709 of the second carbon nanotube 705.

The result, therefore, is a field-effect transistor in which the electrical characteristics of a first carbon nanotube 701 can be controlled by means of a second carbon nanotube 705 as a result of an electric voltage being applied to the second carbon nanotube 705.

FIG. 7B shows the associated profile of the walls of the first carbon nanotube 701 and of the second carbon nanotube 705 of the field-effect transistor 700.

As can be seen from FIG. 7B, the second carbon nanotube 705 is applied to the first carbon nanotube 701 in such a manner that the walls 710, 711 of the first carbon nanotube 701 are directly coupled to the wall 712 of the second carbon nanotube 705 in the contact region 706.

In this context, it should be noted that, according to all the exemplary embodiments of the invention, it is possible to use both single-walled and multi-walled carbon nanotubes.

Figure 8B:
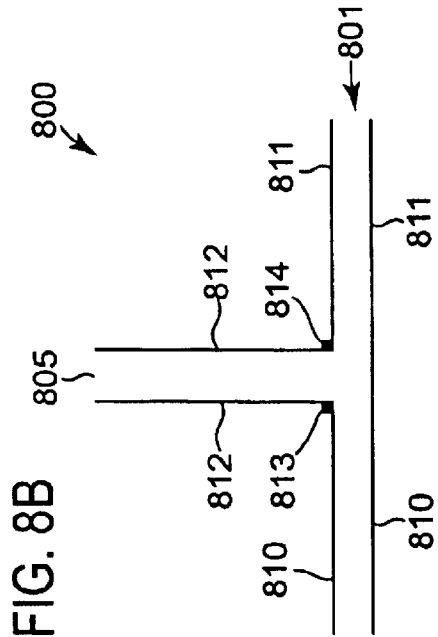
FIGS. 8A and 8B show a cross section through a field-effect transistor in accordance with an eighth exemplary embodiment of the invention, FIG. 8A showing the profile of the materials and FIG. 8B showing the profile of the walls.
Figure 8A:
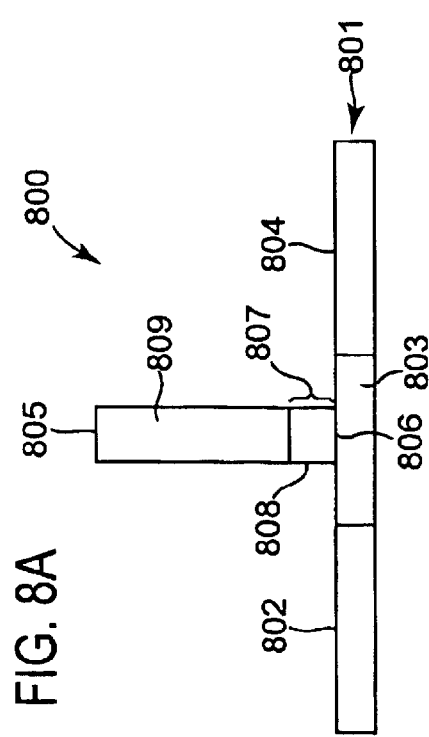

FIG. 8A shows a field-effect transistor 800 in accordance with an eighth exemplary embodiment of the invention.

The field-effect transistor 800 has a first carbon nanotube 801 which, in the same way as the first carbon nanotube 701 of the field-effect transistor 700 in accordance with the seventh exemplary embodiment, forms the source-channel-drain structure of the field-effect transistor 800.

A first region of the first carbon nanotube 801 is a region of an electrically metallically conductive carbon nanotube 802 which forms the source region of the field-effect transistor 800.

An electrically semiconducting nanotube region 803 forms the channel region 803 of the field-effect transistor 800.

A metallically conductive carbon nanotube region 804 which adjoins the channel region 803 forms the drain region of the field-effect transistor 800. In the same way as in the seventh exemplary embodiment, a second carbon nanotube 805 is applied to the first carbon nanotube 801 on the channel region 803 of the first carbon nanotube 801.

Therefore, the result is a contact region 806 between the first carbon nanotube 801 and the second carbon nanotube 805.

The second carbon nanotube 805 is doped with boron atoms or nitrogen atoms in a region 808 of predetermined size, so that an insulating region 807 is formed directly on the first carbon nanotube 801.

The remaining region of the second carbon nanotube 805 remains electrically metallically conductive and forms the gate region 809 of the field-effect transistor 800.

FIG. 8B shows the wall profile of the field-effect transistor 800, once again showing that the walls 810, 811 of the first carbon nanotube 801 clearly form a base to which the second carbon nanotube 805 is applied, and the walls 812 of the second carbon nanotube 805 being applied direct to the first carbon nanotube 801, i.e. is coupled at contact locations 813, 814, which, according to this exemplary embodiment, given a cylindrical second carbon nanotube, has a circular structure. FIG. 9A shows a field-effect transistor 900 in accordance with a ninth exemplary embodiment of the invention.

A first carbon nanotube 905 is applied as boron nitride nanotube to a silicon nanowire 901, which forms the source-channel-drain structure of the field-effect transistor 900 and is electrically semiconducting, in the channel region 903 which is arranged between the source region 902 and the drain region 904 of the field-effect transistor 900, so that a contact region 909 is formed between the silicon nanowire 901 and the first carbon nanotube 905.

A second carbon nanotube 906 is applied, i.e. connected, to the first carbon nanotube 905, the second carbon nanotube 906 forming the gate region of the field-effect transistor 900 and being designed as an electrically metallically conductive carbon nanotube.

Figure 9B:
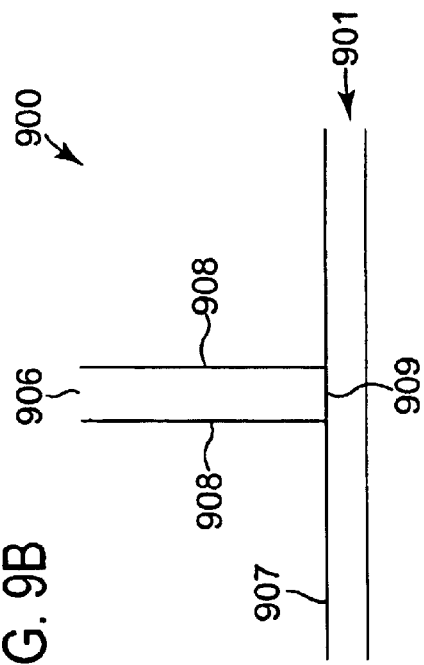
FIGS. 9A and 9B show a cross section through a field-effect transistor in accordance with a ninth exemplary embodiment of the invention, FIG. 9A showing the profile of the materials and FIG. 9B showing the profile of the walls.
Figure 9A:
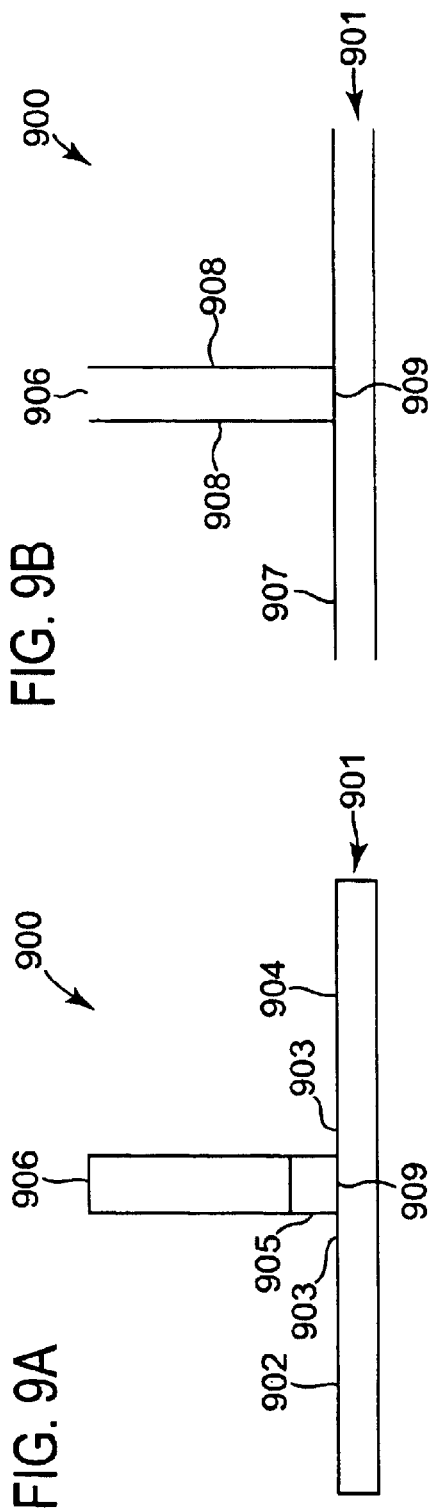

FIG. 9B shows the wall profile of the field-effect transistor 900.

Once again, the first carbon nanowire 905 and the second carbon nanowire 906, which form a common unit, are applied to the silicon nanowire 901, i.e. to its upper wall 907, so that the side walls 908 of this unit are coupled in the contact region 906.

Figure 10B:
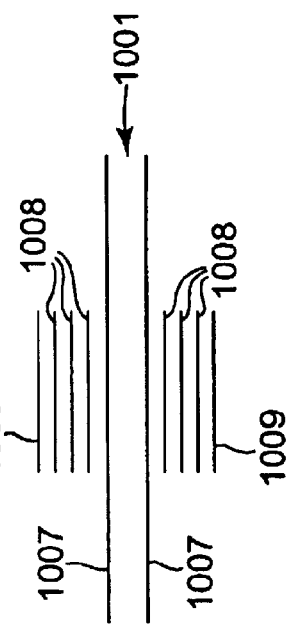
FIGS. 10A and 10B show a cross section through a field-effect transistor in accordance with a tenth exemplary embodiment of the invention, FIG. 10A showing the profile of the materials and FIG. 10B showing the profile of the walls.
Figure 10A:
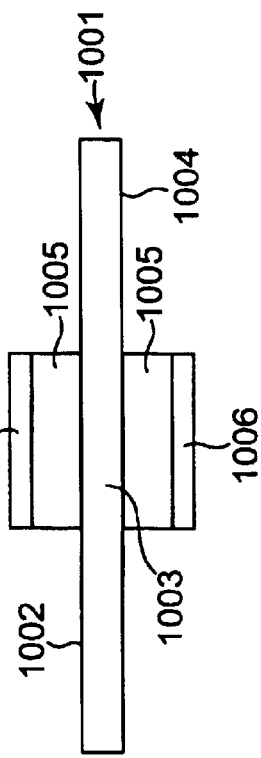

FIG. 10A shows a field-effect transistor 1000 in accordance with a tenth exemplary embodiment of the invention.

Once again, a first carbon nanotube 1001, in accordance with this exemplary embodiment a carbon nanotube which is semiconducting all the way through, or alternatively a semiconducting silicon nanowire or a source-channel-drain structure of the field-effect transistor 1000 which is formed from a plurality of carbon nanotubes with different electrical properties, in accordance with the eighth exemplary embodiment, is provided.

The first carbon nanotube 1001 therefore once again forms a source region 1002, a channel region 1003 and a drain region 1004.

A multi-walled second carbon nanotube 1005, according to the present exemplary embodiment an electrically insulating boron nitride nanotube, is applied to the channel region 1003.

The multi-walled boron nitride nanotube 1005 serves as an insulator in the context of the field-effect transistor 1000.

A further, electrically metallically conductive carbon nanotube 1006, which is used as gate of the field-effect transistor 1000, is applied to the boron nitride nanotube 1005.

FIG. 10B shows the wall profile which corresponds to the field-effect transistor 1000 and in which the walls 1007 of the first carbon nanotube 1001, the walls 1008 of the multi-walled boron nitride nanotube 1005 and the walls 1009 of the second carbon nanotube 1006 are illustrated.

Furthermore, the field-effect transistors presented above can also be formed as a result of the electrically insulating region 708 of the second carbon nanotube 705, 805, 906 being locally replaced by a boron nitride nanotube.

Furthermore, controlled vapor-phase epitaxy can be produced using catalysts to grow the boron nitride nanotube or the metallically conductive carbon nanotube on the corresponding boron nitride nanotube using the process described in [3].

In a further alternative procedure, the individual elements of the field-effect transistor can be assembled using nanomanipulators.

Furthermore, according to an alternative configuration of the invention, there is provision for a carbon nanotube having the length of the desired region 708 to be grown on the first nanowire, i.e. for example the first carbon nanotube, in the channel region of the field-effect transistor formed, using the process described in [3], for this carbon nanotube which has been formed to be doped with boron atoms and nitrogen atoms, so that a boron nitride nanotube is formed, and for the metallically conductive carbon nanotube to be grown on this boron nitride nanotube.

The following publications are cited in this document:

[1] U. Tietze, Ch. Schenk, Halbleiterschaltungstechnik, [Semiconductor circuit technology] 11$^{th}$ edition, Springer Verlag, ISBN 3-540-64192-0, pp. 187-218, 1999.

[2] Z. F. Ren et al., Synthesis of Large Arrays of Well-Aligned Carbon Nanotubes on Glass, SIENCE, Volume 282, pp. 1105-1107, November 1998.

[3] Young Sang Suh and Yin Seong Lee, Highly-Ordered Two-Dimensional Carbon-Nanotubes Areas, Applied Physics Letters, Volume 75, No. 14, pp. 2047-2049, October 1991.

[4] T. Dekker, Carbon-Nanotubes as Molecular Quantum Wires, Physics Today, pp. 22-28, May 1999.

[5] W. Han et al., Synthesis of Boron Nitride Nanotubes From Carbon Nanotubes by a substitution Reaction, Applied Physics Letters, Volume 73, Number 21, pp. 3085-3087, November 1998.

[6] R. Martel et al., Single- and Multi-Wall Carbon Nanotube Field-Effect Transistors, Applied Physics Letters, Volume 73, Number 17, pp. 2447-2449, October 1998.

[7] Sung-Wook Chung et al., Silicon nanowire devices, Applied Physics Letters, Vol. 76, No. 15, pp. 2068-2070, 1999.

[8] A. S. Vedeneev et al., Molecular-Scale Rectifying Diodes Based on Y-Junction Carbon Nanotubes, Proceedings of the IEDM Conference, Washington, 1999.

LIST OF REFERENCE SYMBOLS

100 Field-effect transistor
101 First carbon nanotube
102 Source region
103 Channel region
104 Drain region
105 Insulator layer
106 Second carbon nanotube
200 Field-effect transistor
201 First carbon nanotube
202 First part-nanotube
203 Second part-nanotube
204 Third part-nanotube
300 Field-effect transistor
400 Field-effect transistor
401 First carbon nanotube
402 First part-nanotube
403 Second part-nanotube
404 Third part-nanotube
405 Fourth part-nanotube
406 Fifth part-nanotube
407 Second carbon nanotube
408 Branch
409 Branch
500 Field-effect transistor
501 Second insulator layer
502 Third carbon nanotube
600 Field-effect transistor
601 Bundle of carbon nanotubes
700 Field-effect transistor
701 First carbon nanotube
702 Source region
703 Channel region
704 Drain region
705 Second carbon nanotube
706 Contact region
707 Boron nitride nanotube
708 Predetermined region
709 Region of metallically conductive or semiconducting carbon nanotube
710 Wall of first carbon nanotube
711 Wall of first carbon nanotube
712 Wall of second carbon nanotube
800 Field-effect transistor
801 First carbon nanotube
802 Source region
803 Channel region
804 Drain region
805 Second carbon nanotube
806 Contact region
807 Boron nitride nanotube
808 Predetermined region
809 Region of metallically conductive or semiconducting carbon nanotube
810 Wall of first carbon nanotube
811 Wall of first carbon nanotube
812 Wall of second carbon nanotube
813 Contact location
814 Contact location
900 Field-effect transistor
901 Silicon nanowire
902 Source region
903 Channel region
904 Drain region
905 Boron nitride nanotube
906 Second carbon nanotube
907 Upper wall of silicon nanowire
908 Side wall of carbon nanotube
909 Contact region
1000 Field-effect transistor
1001 First carbon nanotube
1002 Source region
1003 Channel region
1004 Drain region
1005 Multi-walled second carbon nanotube
1006 Metallically conductive carbon nanotube
1007 Wall of first carbon nanotube
1008 Wall of multi-walled boron nitride nanotube
1009 Wall of second carbon nanotube

What is claimed is:

1. A field-effect transistor, comprising:
a nanowire, which forms a source region, a channel region and a drain region of the field-effect transistor, the nanowire being a semiconducting and/or metallically conductive nanowire; and
at least one nanotube, which forms a gate region of the field-effect transistor, the nanotube being a semiconducting and/or metallically conductive nanotube,
the channel region formed by the nanowire and a tip of the nanotube being arranged adjacent to one another and at a distance from one another in such a manner or being set up in such a manner that it is substantially impossible for there to be a tunneling current between the nanowire and the nanotube, and that the conductivity of the channel region of the nanowire can be controlled by means of a field effect as a result of an electric voltage being applied to the nanotube.

2. The field-effect transistor as claimed in claim 1, in which the nanowire is a first nanotube, which forms a source region, a channel region and a drain region of the field-effect transistor, the first nanotube being a semiconducting and/or metallically conductive nanotube, in which the nanotube is formed by a second nanotube, which forms the gate region of the field-effect transistor, the second nanotube being a semi-conducting and/or metallically conductive nanotube, the first nanotube and the second nanotube being arranged at a distance from one another which is such that it is substantially impossible for there to be a tunneling current between the nanotubes and that the conductivity of the channel region of the first nanotube can be controlled by means of a field effect as a result of an electric voltage being applied to the second nanotube.

3. The field-effect transistor as claimed in claim 2, in which the first nanotube or the second nanotube is a carbon nanotube.

4. The field-effect transistor as claimed in one of claims 1 to 3, in which electrically non-conductive gas is introduced between the nanowire and the nanotube.

5. The field-effect transistor as claimed in claim 2 in which the first nanotube and/or the second nanotube has a plurality of walls.

6. The field-effect transistor as claimed in claim 2 in which an insulator layer is applied at least to the channel region of the first nanotube, and
in which the second nanotube is applied to the insulator layer.

7. The field-effect transistor as claimed in claim 6, in which the insulator layer contains an oxide material or a nitride material.

8. The field-effect transistor as claimed in claim 1 in which the nanotube which forms the gate region of the field-effect transistor has three ends, it being possible for an electric voltage to be applied to one end, and the two further ends being arranged in such a manner that, as a result of the applied electric voltage, they can be used to change the conductivitiy of the channel region of the nanowire.

9. The field-effect transistor as claimed in claim 2 in which a third nanotube is provided, which forms a second gate region of the field-effect transistor, the third nanotube being a semiconducting and/or metallically conductive nanotube, and the nanowire and the third nanotube being arranged at a distance from one another which is such that it is substantially impossible for there to be a tunneling current between the nanowire and the third nanotube, and that the conductivity of the channel region of the nanowire can be controlled by means of a field effect as a result of an electric voltage being applied to the third nanotube.

10. The field-effect transistor as claimed in claim 9 in which the nanotube which forms the gate region of the field-effect transistor and the third nanotube are electrically coupled to one another.

11. The field-effect transistor as claimed in claim 1 in which at least one of the nanotubes includes a multiplicity of nanotubes.

12. The field-effect transistor as claimed in claim 1, in which the at least one nanotube is applied to the nanowire and includes an electrically insulating region and a semiconducting region or a metallically conductive region, the insulating region of the nanotube being applied to the channel region of the nanowire in such a manner that the insulating region of the nanotube forms an insulator of the field-effect transistor and, that the semiconducting region or the metallically conductive region of the nanotube forms a gate region of the field-effect transistor.

13. The field-effect transistor as claimed in claim 12, in which the nanowire is a silicon nanowire.

14. The field-effect transistor as claimed in claim 12 in which the nanowire is a further nanotube.

15. The field-effect transistor as claimed in claim 14, in which the further nanotube is a further carbon nanotube.

16. The field-effect transistor as claimed in claim 14 or 15, in which the further nanotube includes at least one semiconducting region and at least one metallically conductive region.

17. The field-effect transistor as claimed in claim 16, in which the semiconducting region is arranged between two metallically conductive regions.

18. The field-effect transistor as claimed in claim 12 in which the insulating region of the nanotube is a boron nitride nanotube.

19. The field-effect transistor as claimed in claim 12 in which the semiconducting region or the metallically conductive region of the nanotube is a carbon nanotube.

20. The field-effect transistor as claimed in claim 12 in which at least one of the nanotubes includes a plurality of walls.

21. A field-effect transistor, comprising:

a nanowire, which forms a source region, a channel region and a drain region of the field-effect transistor, the nanowire being a semiconducting and/or metallically conductive nanowire; and at least one nanotube, which form a gate region of the field-effect transistor, the nanotube being a semiconducting and/or metallically conductive nanotube, the nanowire and the nanotube being arranged at a distance from one another, at least one further electrically insulating nanotube as a gate insulator arranged concentrically between the nanowire and the nanotube in such a manner or being set up in such a manner that it is substantially impossible for there to be a tunneling current between the nanowire and the nanotube, and that the conductivity of the channel region of the nanowire can be controlled by means of a field effect as a result of an electric voltage being applied to the nanotube.

22. The field-effect transistor as claimed in claim 21, having the nanowire, which forms a source region, a channel region and a drain region of the field-effect transistor, having the at least one electrically insulating nanotube which is applied to the nanowire and forms the gate insulator of the field-effect transistor, and having the at least one electrically semiconducting or metallically conductive nanotube which is applied to the insulating nanotube and forms a gate region of the field-effect transistor.

23. The field-effect transistor as claimed in claim 21, in which the electrically insulating nanotube is a boron nitride nanotube.

24. The field-effect transistor as claimed in claim 21, in which the semiconducting or metallically conductive nanotube is a carbon nanotube.

* * * * *

UNITED STATES PATENT AND TRADEMARK OFFICE
CERTIFICATE OF CORRECTION

PATENT NO. : 6,798,000 B2
DATED : September 28, 2004
INVENTOR(S) : Richard Johannes Luyken et al.

It is certified that error appears in the above-identified patent and that said Letters Patent is hereby corrected as shown below:

<u>Column 2,</u>
Line 24, after "junction or an", please replace "pn" with -- np --;
Line 30, after "pn junctions or", please replace "pn" with -- np --;
Line 33, after "region and the", please replace "n-doped" with -- p-doped --;
Line 34, please replace "undoped" with -- n-doped --.

Signed and Sealed this

Seventh Day of June, 2005

JON W. DUDAS
*Director of the United States Patent and Trademark Office*